(12) United States Patent
Li

(10) Patent No.: US 9,954,672 B1
(45) Date of Patent: Apr. 24, 2018

(54) DIGITAL SIGNAL INPUT CIRCUIT

(71) Applicant: Huawei Technologies Co., Ltd., Shenzhen (CN)

(72) Inventor: Jianzhao Li, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/727,727

(22) Filed: Oct. 9, 2017

(30) Foreign Application Priority Data

Oct. 9, 2016 (CN) .......................... 2016 1 0879680

(51) Int. Cl.

| H03M 3/00 | (2006.01) |
|---|---|
| G02B 27/00 | (2006.01) |
| H04L 7/00 | (2006.01) |
| H03K 17/18 | (2006.01) |
| G01R 15/14 | (2006.01) |
| G01R 19/25 | (2006.01) |
| H03M 1/06 | (2006.01) |
| H04B 10/80 | (2013.01) |
| H03K 17/78 | (2006.01) |

(52) U.S. Cl.
CPC .......... *H04L 7/0029* (2013.01); *G01R 15/144* (2013.01); *G01R 19/2506* (2013.01); *H03K 17/18* (2013.01); *H03K 17/78* (2013.01); *H03M 1/0602* (2013.01); *H04B 10/802* (2013.01)

(58) Field of Classification Search
CPC .............. H04L 7/0029; H03M 1/0602; G01R 19/2506; G01R 15/144; H03K 17/18; H03K 17/78; H04B 10/802

USPC ............................................ 341/143; 250/551
See application file for complete search history.

(56) References Cited

U.S. PATENT DOCUMENTS

| 4,292,551 A | * | 9/1981 | Kolmann | ................ H04L 25/26 |
|---|---|---|---|---|
| | | | | 250/551 |
| 5,995,252 A | * | 11/1999 | Nemer | ................. H04B 10/802 |
| | | | | 250/551 |

(Continued)

FOREIGN PATENT DOCUMENTS

| WO | 9630917 A1 | 10/1996 |
|---|---|---|
| WO | 2014060922 A2 | 4/2014 |
| WO | 2015066566 A1 | 5/2015 |

OTHER PUBLICATIONS

Foreign Communication From a Counterpart Application, European Application No. 17194358.2, Extended European Search Report dated Feb. 20, 2018, 9 pages.

*Primary Examiner* — Khai M Nguyen
(74) *Attorney, Agent, or Firm* — Conley Rose, P.C.

(57) ABSTRACT

A digital signal input circuit including an isolating circuit and a voltage determining circuit is presented, where a first port of an input end of the isolating circuit receives a digital signal, an output end of the isolating circuit outputs the digital signal, and when the isolating circuit is open, the isolating circuit is configured to output a first level, or when the isolating circuit is closed, the isolating circuit is configured to output a second level; and the voltage determining circuit is configured to determine, according to a level of the digital signal, whether the isolating circuit is open or closed. According to the digital signal input circuit, the voltage determining circuit determines a level of a digital signal, thereby correctness of digital signal level conversion is increased.

10 Claims, 2 Drawing Sheets

(56) References Cited

U.S. PATENT DOCUMENTS

| | | | | |
|---|---|---|---|---|
| 6,756,601 B2 * | 6/2004 | Dodson, III | ......... | H04B 10/801 250/205 |
| 8,866,113 B2 * | 10/2014 | Holland | ............... | H04B 10/802 250/551 |

* cited by examiner

DIGITAL SIGNAL INPUT CIRCUIT

CROSS-REFERENCE TO RELATED APPLICATION

This application claims priority to Chinese Patent Application No. 201610879680.8, filed on Oct. 9, 2016, which is hereby incorporated by reference in its entirety.

TECHNICAL FIELD

Embodiments of the present disclosure relate to the communications field, and in particular, to a digital signal input circuit.

BACKGROUND

As data transmission service demands increase, interconnection between integrated circuit (IC) chips becomes increasingly important. A level conversion circuit needs to be connected between different chips, to implement digital signal level conversion between the different chips.

FIG. 1 is a schematic circuit diagram of a digital signal input circuit. It can be learned from a circuit 100 shown in FIG. 1 that a digital signal is inputted from a digital input (DI) port, and is inputted into an isolating circuit 110 after voltage division by means of a resistor R1 and a resistor R2. A light emitting diode 120 in the isolating circuit determines whether a level of the digital signal is a high level or a low level. Finally, the level of the digital signal is converted, using a pull-up resistor R3, into a level that can be supported by a target chip. The converted digital signal is outputted from a digital output (DO) port, and is inputted into the target chip. In the circuit 100, the light emitting diode in the isolating circuit determines whether the level of the digital signal is a high level or a low level. However, precision of determining a level by a light emitting diode is relatively low, and a conversion error easily occurs when a level of a digital signal is converted.

SUMMARY

This application provides a digital signal input circuit, so as to increase correctness of digital signal level conversion.

A first aspect provides a digital signal input circuit, including an isolating circuit and a voltage determining circuit, where a first port of an input end of the isolating circuit is connected to an input end of a digital signal, an output end of the isolating circuit is connected to an output end of the digital signal, and when the isolating circuit is open, the isolating circuit is configured to output a first level, or when the isolating circuit is closed, the isolating circuit is configured to output a second level; and an input end of the voltage determining circuit is connected to the input end of the digital signal, an output end of the voltage determining circuit is connected to a second port of the input end of the isolating circuit, and the voltage determining circuit is configured to determine, according to a level of the digital signal, whether the isolating circuit is open or closed.

According to the digital signal input circuit, a voltage determining circuit determines a level of a digital signal, so as to avoid determining of a level of a digital signal by means of a light emitting diode in the prior art. In this way, correctness of digital signal level conversion is increased.

In a possible implementation, the voltage determining circuit includes a voltage comparator, a first input end of the voltage comparator is connected to the input end of the digital signal, a second input end of the voltage comparator is connected to a reference voltage source, and an output end of the voltage comparator is connected to a switching device, where the voltage comparator is configured to control an on/off state of the switching device according to a high-low relationship between the level of the digital signal and a level of the reference voltage source, and the switching device is configured to control the isolating circuit to be open or closed.

Optionally, the first input end of the voltage comparator is a non-inverting input end, and the second input end of the voltage comparator is an inverting input end.

In this solution, a voltage comparator in a voltage determining circuit determines a level of a digital signal, so as to avoid determining of a level of a digital signal by means of a light emitting diode in the prior art. In this way, correctness of digital signal level conversion is increased.

Further, generally, a digital signal level range supported by a voltage comparator is larger than a digital signal level range supported by a light emitting diode. That is, compared with a digital signal input circuit in the prior art, the digital signal input circuit provided in this solution can support a larger digital signal level conversion range.

Optionally, the first input end of the voltage comparator is a non-inverting input end, and the second input end of the voltage comparator is an inverting input end.

The foregoing switching device may be a bipolar transistor or a metal-oxide semiconductor (MOS) field-effect transistor.

Optionally, the voltage determining circuit includes a voltage comparator, a first input end of the voltage comparator is connected to the input end of the digital signal, a second input end of the voltage comparator is connected to a reference voltage source, and an output end of the voltage comparator is connected to a switching device using a controller. The voltage comparator controls an on/off state of the switching device using the controller, and the on/off state of the switching device can control the isolating circuit to be open or closed.

In a possible implementation, the switching device is a bipolar transistor, the output end of the voltage comparator is connected to a base of the bipolar transistor, a collector of the bipolar transistor is connected to the isolating circuit, and an emitter of the bipolar transistor is grounded.

In a possible implementation, the voltage determining circuit further includes a resistive voltage division circuit, an input end of the resistive voltage division circuit is connected to the input end of the digital signal, and an output end of the resistive voltage division circuit is connected to the non-inverting input end of the voltage comparator, where the resistive voltage division circuit is configured to perform voltage division on the digital signal.

In this solution, a digital signal on which a resistive voltage division circuit performs voltage division is inputted into a voltage comparator. In this way, when a level range supported by the voltage comparator is fixed, the digital signal level range supported by the voltage comparator is expanded to some extent.

Further, a resistance value in the resistive voltage division circuit may be further adjusted, so as to adjust a digital signal level range supported by the digital signal input circuit.

In a possible implementation, a collector of the isolating circuit includes a photobipolar transistor, an output end of the photobipolar transistor is connected to a power supply using a pull-up resistor, the output end of the photobipolar transistor is connected to the output end of the digital signal, and the power supply is configured to provide a voltage to the pull-up resistor to convert the level of the digital signal into the first level or the second level.

In this solution, a level of a digital signal is adjusted using a pull-up resistor connected to an output end of a photobipolar transistor, so as to adjust the level of the digital signal to a level supported by a target chip.

In a possible implementation, a collector of the isolating circuit includes a photobipolar transistor, an input end of the photobipolar transistor is connected to a power supply using a pull-up resistor, the input end of the photobipolar transistor is connected to the output end of the digital signal, and the power supply is configured to provide a voltage to the pull-up resistor to convert the level of the digital signal into the first level or the second level.

In this solution, a level of a digital signal is adjusted using a pull-up resistor connected to an input end of a photobipolar transistor, so as to adjust the level of the digital signal to a level supported by a target chip.

In a possible implementation, the digital signal input circuit further includes a constant current source circuit, and an emitter of the isolating circuit includes a light emitting diode, where an input end of the constant current source circuit is connected to the input end of the digital signal, an output end of the constant current source circuit is connected to the light emitting diode of the isolating circuit, and the constant current source circuit is configured to provide a constant current to the light emitting diode.

Optionally, the constant current source circuit is encapsulated into a constant current source chip.

In this solution, a constant current source circuit provides a constant current to a light emitting diode, to ensure that the light emitting diode properly works.

In a possible implementation, the constant current source circuit includes a first bipolar transistor, a second bipolar transistor, and a resistor, a model of the first bipolar transistor is the same as a model of the second bipolar transistor, and the first bipolar transistor and branch circuits in which the resistor and the second bipolar transistor are located are connected in parallel between the input end and the output end of the constant current source circuit.

In this solution, a constant current is provided to a light emitting diode using a feature that BE knot voltages of bipolar transistors with a same model are similar. This can ensure that the light emitting diode properly works.

DESCRIPTION OF EMBODIMENTS

The following describes the technical solutions in the embodiments of the present disclosure with reference to the accompanying drawings in the embodiments of the present disclosure. The described embodiments are some rather than all of the embodiments of the present disclosure. All other embodiments obtained by a person of ordinary skill in the art based on the embodiments of the present disclosure without creative efforts shall fall within the protection scope of the present disclosure.

Figure 1:
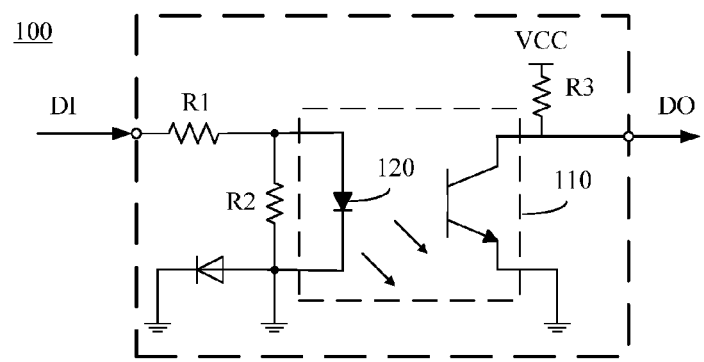
FIG. 1 is a schematic circuit diagram of a digital signal input circuit in the prior art.
Figure 2:
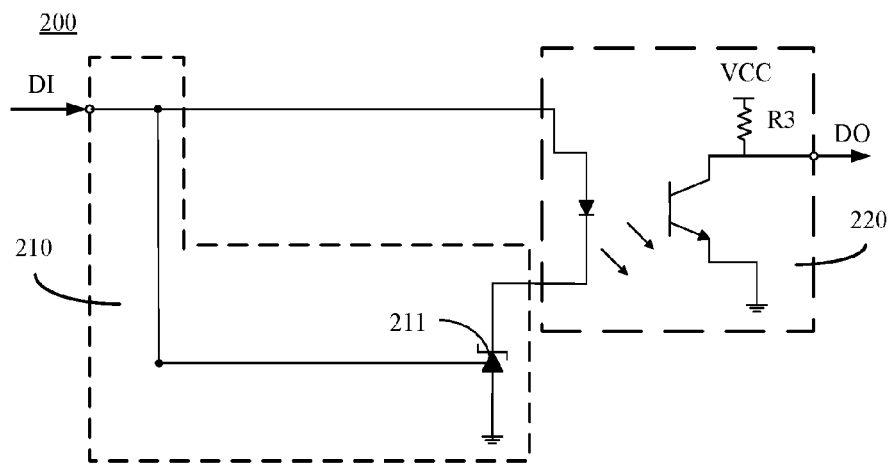
FIG. 2 is a schematic circuit diagram of a digital signal input circuit according to an embodiment of the present disclosure.

FIG. 2 is a schematic circuit diagram of a digital signal input circuit according to an embodiment of the present disclosure. A circuit 200 shown in FIG. 2 includes a voltage determining circuit 210 and an isolating circuit 220.

Isolating circuit 220: A first port of an input end of the isolating circuit is connected to an input end of a digital signal (the "DI" port as shown in FIG. 2), an output end of the isolating circuit is connected to an output end of the digital signal (the "DO" port as shown in FIG. 2), and when the isolating circuit is open, the isolating circuit is configured to output a first level, or when the isolating circuit is closed, the isolating circuit is configured to output a second level, so as to output a converted digital signal.

Voltage determining circuit 210: An input end of the voltage determining circuit is connected to the input end of the digital signal, an output end of the voltage determining circuit is connected to a second port of the input end of the isolating circuit, and the voltage determining circuit is configured to determine, according to a level of the digital signal, whether the isolating circuit is open or closed.

The foregoing digital signal may be a signal that carries a digital parameter.

The voltage determining circuit may determine, according to the level of the digital signal, whether the isolating circuit is open or closed, to control the level of the digital signal that is outputted by the isolating circuit. For example, when the voltage determining circuit determines that the digital signal is at a high level, the voltage determining circuit controls the isolating circuit to be closed, and the output end of the isolating circuit may adjust the high level of the digital signal to a low level in a range that can be supported by a chip. When the voltage determining circuit determines that the digital signal is at a low level, the voltage determining circuit controls the isolating circuit to be open, and the output end of the isolating circuit can adjust the low level of the digital signal to a high level in a range that can be supported by a chip.

The isolating circuit may convert the level of the digital signal into a first level or a second level in a range that can be supported by a target chip. The first level may be a high level in the range that can be supported by the target chip, and correspondingly, the second level may be a low level in the range that can be supported by the target chip. Alternatively, the first level may be a low level in the range that can be supported by the target chip, and correspondingly, the second level may be a high level in the range that can be supported by the target chip.

That the foregoing circuit converts the level of the digital signal into a level that can be supported by a chip further includes converting a high level of the digital signal into a low level that can be supported by the chip, or converting a low level of the digital signal into a high level that can be supported by the chip.

The foregoing isolating circuit may be an optical coupling circuit, and the optical coupling circuit is generally a device that transmits an electrical signal using light as a medium. A light emitter (for example, an infrared light emitting diode) and a light receiver (for example, a photosensitive semiconductor transistor) are generally encapsulated in a same pipe shell. When an electrical signal is inputted into an input end (that is, an emitter) at which the light emitter is located, the light emitter transmits a ray. An output end (that is, a collector) at which the light receiver is located receives the ray, and generates a photocurrent, which is outputted from the output end of the isolating circuit. In this way, "electric-photo-electric" conversion is implemented, and electric isolation is implemented at the input end of the isolating circuit and the output end of the isolating circuit.

Optionally, the foregoing isolating circuit may be an optical coupling circuit. The first port of the input end of the isolating circuit may be a port connected to a positive electrode of a light emitting diode in the optical coupling circuit, and the second port of the input end of the isolating circuit may be a port connected to a negative electrode of the light emitting diode. Alternatively, the first port of the input end of the isolating circuit may be a port connected to a negative electrode of a light emitting diode in the optical coupling circuit, and the second port of the input end of the isolating circuit may be a port connected to a positive electrode of the light emitting diode. For the digital signal input circuit shown in FIG. 2, that the output end of the voltage determining circuit is connected to the isolating circuit using the second port of the input end of the isolating circuit is merely used as an example. The present disclosure sets no specific limitation on a form of a connection between the voltage determining circuit and the isolating circuit.

For ease of description below, the digital signal input circuit shown in FIG. 2 is referred to as a branch circuit. The branch circuit may convert a digital signal at a high level into a digital signal at a low level, and the branch circuit may further adjust a level of a digital signal to adapt to a digital signal level range supported by a target chip.

Optionally, in an embodiment, the voltage determining circuit includes a voltage comparator, a first input end of the voltage comparator is connected to the input end of the digital signal, a second input end of the voltage comparator is connected to a reference voltage source, and an output end of the voltage comparator is connected to a switching device. The voltage comparator is configured to control a connectivity status of the switching device according to a high-low relationship between the level of the digital signal and a level of the reference voltage source, and the switching device is configured to control the isolating circuit to be open or closed.

The foregoing switching device may be a device such as a bipolar transistor or a MOS transistor.

Optionally, the first input end of the voltage comparator is a non-inverting input end, and the second input end of the voltage comparator is an inverting input end. When the level of the digital signal is higher than the level of the reference voltage source, the voltage comparator outputs a digital signal at a high level. When the level of the digital signal is lower than the level of the reference voltage source, the voltage comparator outputs a digital signal at a low level.

Optionally, the first input end of the voltage comparator is an inverting input end, and the second input end of the voltage comparator is a non-inverting input end. When the level of the digital signal is higher than the level of the reference voltage source, the voltage comparator outputs a digital signal at a low level. When the level of the digital signal is lower than the level of the reference voltage source, the voltage comparator outputs a digital signal at a high level.

Optionally, the voltage determining circuit includes a voltage comparator, a first input end of the voltage comparator is connected to the input end of the digital signal, a second input end of the voltage comparator is connected to a reference voltage source, and an output end of the voltage comparator is connected to a switching device using a controller. The voltage comparator controls an on/off state of the switching device using the controller, and the on/off state of the switching device may be used to control the isolating circuit to be open or closed.

The foregoing switching device may be a bipolar transistor or a MOS transistor. The foregoing controller may be a microcontroller unit (MCU), or the foregoing controller may be another device that can control, using the switching device, the isolating circuit to be open or closed. This embodiment of the present disclosure sets no limitation on a specific implementation form of the controller.

Optionally, the output end of the voltage comparator is connected to a base of the bipolar transistor, a collector of the bipolar transistor is connected to the isolating circuit, an emitter of the bipolar transistor is grounded, and the voltage comparator controls, using the bipolar transistor, the isolating circuit to be open or closed.

Figure 3:
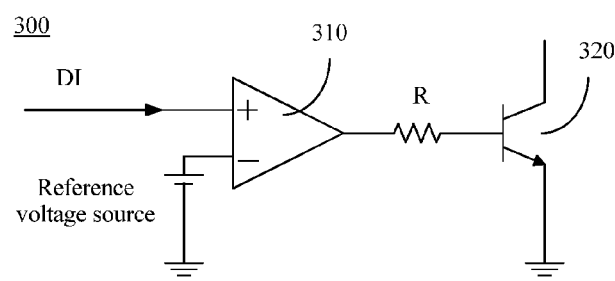
FIG. 3 is a schematic circuit diagram of a principle of a voltage determining circuit according to an embodiment of the present disclosure.

For example, FIG. 3 shows a schematic circuit diagram of a principle of a voltage determining circuit according to an embodiment of the present disclosure. It should be understood that a circuit 300 shown in FIG. 3 may be at a location of 211 in FIG. 2. An input end of a digital signal is connected to a non-inverting input end of a voltage comparator 310, an inverting input end of the voltage comparator 310 is connected to a reference voltage source, and an output end of the voltage comparator is connected to a base of a bipolar transistor 320 using a resistor R. The resistor R may be used to adjust a voltage that is outputted by the voltage comparator. A collector of the bipolar transistor is connected to an input end of an isolating circuit (which is not shown in FIG. 3), and an emitter of the bipolar transistor may be grounded.

When a level of a digital signal that is inputted by the input port of the digital signal is higher than a voltage of the reference voltage source, the voltage comparator outputs a digital signal at a high level, and the high level may be used as a voltage of the emitter of the bipolar transistor. When a voltage of the high level is greater than a breakover voltage of a PN knot of the bipolar transistor, the bipolar transistor is in a conductive state, that is, a branch circuit in which the input end of the isolating circuit that is connected to the bipolar transistor is in a conductive state. That is, the light emitting diode in the isolating circuit is conductive.

In the foregoing schematic circuit diagram, the voltage determining circuit is only used to implement a principle of voltage determining. In an implementation process, various variations may be made to the foregoing circuit diagram, and a new device may be added in the foregoing circuit diagram. The present disclosure sets no specific limitation on a connection manner of the voltage determining circuit.

In a process of implementing the foregoing voltage determining circuit, the voltage determining circuit may be implemented using a dedicated chip of the voltage determining circuit, or may be implemented using an operation amplifying circuit. The present disclosure sets no specific limitation on an implementation form of the voltage determining circuit.

Optionally, the voltage determining circuit further includes a resistive voltage division circuit, an input end of the resistive voltage division circuit is connected to the input end of the digital signal, and an output end of the resistive voltage division circuit is connected to the non-inverting input end of the voltage comparator, where the resistive voltage division circuit is configured to perform voltage division on the digital signal.

Figure 4:
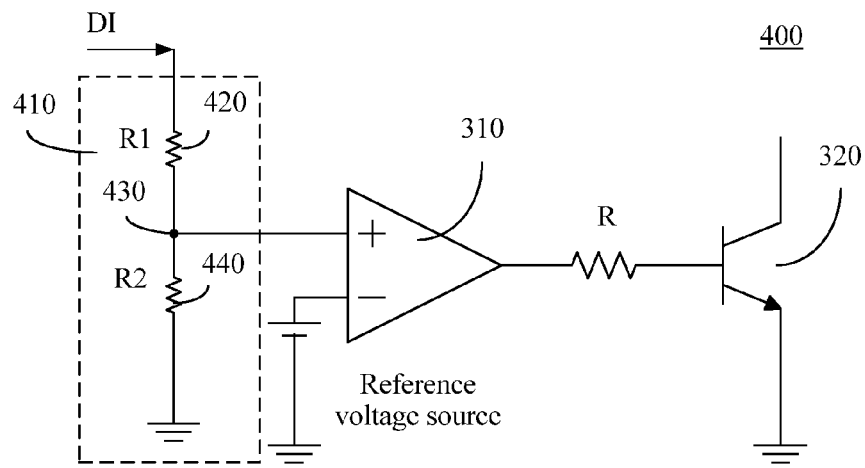
FIG. 4 is a schematic circuit diagram of a principle of a voltage determining circuit according to another embodiment of the present disclosure.

For example, FIG. 4 is a schematic circuit diagram of a principle of a voltage determining circuit according to another embodiment of the present disclosure. It should be understood that a same reference sign is used for a same device in the circuit diagram shown in FIG. 4 and the circuit diagram shown in FIG. 3. For brevity, details are not described herein.

Based on the voltage determining circuit 300 shown in FIG. 3, a resistive voltage division circuit 410 is added to a voltage determining circuit 400 shown in FIG. 4. It can be learned from the resistive voltage division circuit 410 shown in FIG. 4 that the resistive voltage division circuit may include a first resistor 420 and a second resistor 440. One end of the first resistor is connected to an input end of a digital signal, the first resistor and the second resistor are serially connected, and an output end of the resistive voltage division circuit is connected to a non-inverting input end of the voltage comparator 310. When the digital signal is inputted from an input end, the first resistor and the second resistor that are serially connected perform voltage division, and the digital signal is outputted from an output end 430 between the first resistor and the second resistor.

Resistance values of the first resistor and the second resistor in the resistive voltage division circuit may be set according to a related performance parameter of a voltage comparator. The present disclosure sets no specific limitation thereto.

The foregoing resistive voltage division circuit is configured to perform voltage division on a level of a digital signal, to expand a digital signal level range. The present disclosure sets no specific limitation on a form of a voltage division circuit. There may be another circuit that can be used for voltage division or voltage stabilization.

When a resistance value of the first resistor 420 is R1, a resistance value of the second resistor 440 is R2, a voltage of a reference voltage source of the voltage comparator is $V_{ref}$, and a maximum voltage that can be supported by a target chip is $V_{max}$. Therefore, a digital signal voltage range that can be supported by the voltage determining circuit may be $V_{ref} \times (R1+R2)/R2$ to $V_{max} \times (R1+R2)/R2$. When the level of the digital signal is lower than $V_{ref}$, the voltage comparator does not work.

Optionally, a collector of the isolating circuit includes a photobipolar transistor, an output end of the photobipolar transistor is connected to a power supply using a pull-up resistor (R3 as shown in FIG. 2), the output end of the photobipolar transistor is connected to the output end of the digital signal (the "DO" port as shown in FIG. 2), and the power supply is configured to provide a voltage to the pull-up resistor to convert the level of the digital signal into the first level or the second level, so as to obtain the converted digital signal.

For example, when a level that is outputted by the isolating circuit is less than a voltage range that can be supported by the target chip, the pull-up resistor may be used to provide a current component to "pull high" the level of the digital signal, so as to meet a level that can be supported by the target chip.

Optionally, in an embodiment, the digital signal input circuit further includes a constant current source circuit, and an emitter of the isolating circuit includes a light emitting diode. An input end of the constant current source circuit is connected to the input end of the digital signal (the "DI" port as shown in FIG. 2), an output end of the constant current source circuit is connected to the light emitting diode of the isolating circuit, and the constant current source circuit is configured to provide a constant current to the light emitting diode.

The foregoing constant current source circuit may be implemented using a transistor, may be implemented using a field effect, or may be implemented using a shunt regulator. The present disclosure sets no specific limitation on an implementation form of the constant current source circuit.

Optionally, the constant current source circuit includes two bipolar transistors with a same model and a resistor, the two bipolar transistors include a first bipolar transistor and a second bipolar transistor, and the first bipolar transistor and branch circuits in which the resistor and the second bipolar transistor are located are connected in parallel between the input end and the output end of the constant current source circuit.

Figure 5:
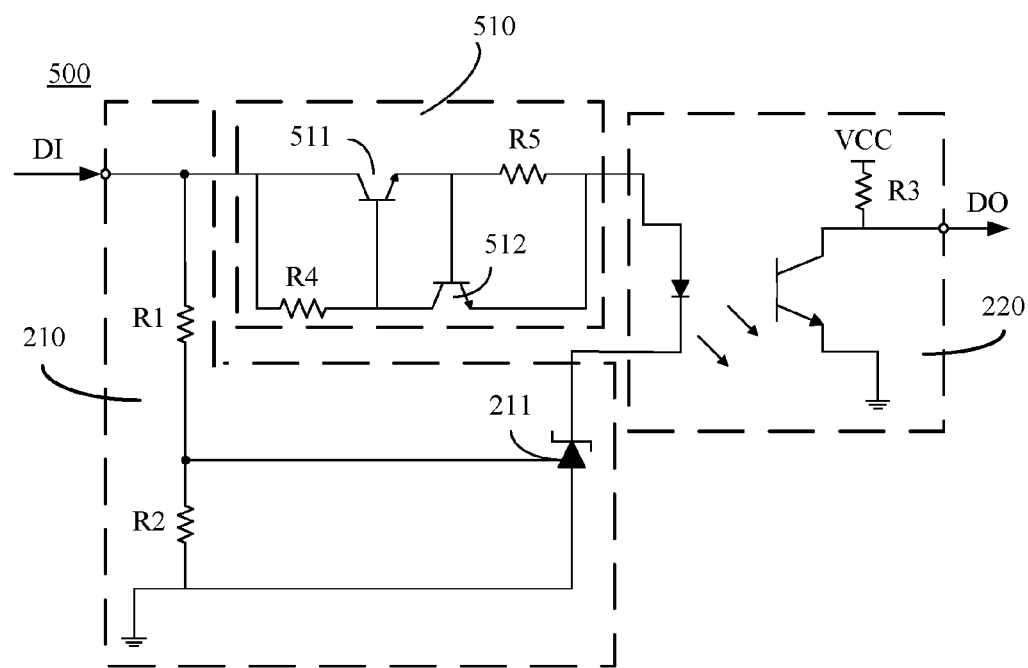
FIG. 5 is a schematic circuit diagram of a principle of a digital signal input circuit according to another embodiment of the present disclosure.

FIG. 5 shows a schematic circuit diagram of a principle of a digital signal input circuit according to another embodiment of the present disclosure. It should be understood that a same reference sign is used for a device in the circuit shown in FIG. 5 and a device in the circuit diagram shown in FIG. 2. For brevity, details are not described herein. A circuit 500 shown in FIG. 5 includes a constant current source circuit 510. It can be learned from FIG. 5 that a constant current source circuit 510 includes two bipolar transistors with a same model: a bipolar transistor 511 a bipolar transistor 512. The constant current source circuit may provide a relatively constant current to the light emitting diode in the isolating circuit 220 using a resistor R5 and a relatively stable voltage (a BE knot voltage) between a base (also referred to as a B electrode) and an emitter (also referred to as an E electrode) of the bipolar transistor 511 and the bipolar transistor 512.

In the schematic circuit diagram of the constant current source circuit 510 shown in FIG. 5, the devices in the constant current source circuit may be modified, or another device may be added to improve performance of the constant current source circuit. The present disclosure sets no specific limitation on a connection form of the constant current source circuit.

It should be understood that sequence numbers of the foregoing processes do not mean execution sequences in various embodiments of the present disclosure. The execution sequences of the processes should be determined according to functions and internal logic of the processes, and should not be construed as any limitation on the implementation processes of the embodiments of the present disclosure.

A person of ordinary skill in the art may be aware that, the units and algorithm steps in the examples described with reference to the embodiments disclosed in this specification may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present disclosure.

The foregoing descriptions are merely specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A digital signal input circuit, comprising:
an isolating circuit, comprising:
an isolating circuit input end having a first port and a second port, wherein the first port is connected to a digital input (DI) port of the digital signal input circuit and configured to receive a digital signal; and
an isolating circuit output end is connected to a digital output (DO) port of the digital signal input circuit and configured to output a converted digital signal, wherein the isolating circuit is configured to:
output a first level when the isolating circuit is open; and
output a second level when the isolating circuit is closed; and
a voltage determining circuit coupled to the isolating circuit, comprising:
a voltage determining circuit input end connected to the DI port and configured to receive the digital signal;
a voltage determining circuit output end coupled to the second port of the isolating circuit, wherein the voltage determining circuit is configured to determine, according to a level of the digital signal, whether the isolating circuit is open or closed.

2. The digital signal input circuit according to claim 1, wherein the voltage determining circuit further comprises:
a switching device; and
a voltage comparator coupled to the switching device, comprising:
a first voltage comparator input end is connected to the DI port and configured to receive the digital signal;
a second voltage comparator input end coupled to a reference voltage source; and
an output end of the voltage comparator coupled to the switching device,
wherein the voltage comparator is configured to control an on/off state of the switching device according to a high-low relationship between the level of the digital signal and a level of the reference voltage source, and wherein the switching device is configured to control the isolating circuit to be open or closed.

3. The digital signal input circuit according to claim 2, wherein the first voltage comparator input end is a non-inverting input end, and wherein the second voltage comparator input end is an inverting input end.

4. The digital signal input circuit according to claim 2, wherein the switching device is a bipolar transistor, wherein the output end of the voltage comparator is coupled to a base of the bipolar transistor, wherein a collector of the bipolar transistor is coupled to the isolating circuit, and wherein an emitter of the bipolar transistor is grounded.

5. The digital signal input circuit according to claim 2, wherein the voltage determining circuit further comprises a resistive voltage division circuit, comprising:
a resistive voltage division circuit input end connected to the DI port and configured to receive the digital signal; and
a resistive voltage division circuit output end coupled to the non-inverting input end of the voltage comparator, wherein the resistive voltage division circuit is configured to perform voltage division on the digital signal.

6. The digital signal input circuit according to claim 1, wherein a collector of the isolating circuit comprises a photobipolar transistor, wherein an output end of the photobipolar transistor is coupled to a power supply using a pull-up resistor, wherein the output end of the photobipolar transistor is connected to the DO port and configured to output the converted digital signal, and wherein the power supply is configured to provide a voltage to the pull-up resistor to convert the level of the digital signal into the first level or the second level.

7. The digital signal input circuit according to claim 1, wherein a collector of the isolating circuit comprises a photobipolar transistor, wherein an input end of the photobipolar transistor is coupled to a power supply using a pull-up resistor, wherein the input end of the photobipolar transistor is connected to the DO port and configured to output the converted digital signal, and wherein the power supply is configured to provide a voltage to the pull-up resistor to convert the level of the digital signal into the first level or the second level.

8. The digital signal input circuit according to claim 1, wherein the digital signal input circuit further comprises a constant current source circuit coupled to the isolating circuit, wherein an emitter of the isolating circuit comprises a light emitting diode, wherein an input end of the constant current source circuit is connected to the DI port and configured to receive the digital signal, wherein an output end of the constant current source circuit is coupled to the light emitting diode of the isolating circuit, and wherein the constant current source circuit is configured to provide a constant current to the light emitting diode.

9. The digital signal input circuit according to claim 8, wherein the constant current source circuit comprises a first bipolar transistor, a second bipolar transistor, and a resistor, wherein a model of the first bipolar transistor is the same as a model of the second bipolar transistor, and wherein the first bipolar transistor and branch circuits in which the resistor and the second bipolar transistor are located are coupled in parallel between the input end and the output end of the constant current source circuit.

10. The digital signal input circuit according to claim 8, wherein the constant current source circuit is encapsulated into a constant current source chip.

* * * * *